United States Patent [19]

Neudecker

[11] Patent Number: 5,751,196
[45] Date of Patent: May 12, 1998

[54] CIRCUIT ARRANGEMENT FOR COMPENSATING FREQUENCY DEVIATIONS OF A VOLTAGE-CONTROLLED OSCILLATOR, USING A SECOND OSCILLATOR

[75] Inventor: Albrecht Neudecker, Munich, Germany

[73] Assignee: Siemens Aktiengesellschaft, Munich, Germany

[21] Appl. No.: 621,621

[22] Filed: Mar. 26, 1996

[30] Foreign Application Priority Data

Mar. 28, 1995 [DE] Germany .................. 195 11 402.7

[51] Int. Cl.$^6$ .................. H03B 5/04; H03L 1/00
[52] U.S. Cl. .................. 331/47; 331/57; 331/176
[58] Field of Search .................. 331/47, 57, 175, 331/176

[56] References Cited

U.S. PATENT DOCUMENTS

| Re. 34,317 | 7/1993 | Ikeda | 331/25 |
|---|---|---|---|
| 3,713,033 | 1/1973 | Frerking | 331/116 R |
| 4,492,933 | 1/1985 | Grieco | 331/66 |
| 4,904,955 | 2/1990 | Ley | 331/2 |
| 5,357,220 | 10/1994 | Francis | 331/113 R |
| 5,438,599 | 8/1995 | Lincoln | 327/40 |

FOREIGN PATENT DOCUMENTS

| 0 133 388 | 2/1985 | European Pat. Off. . |
|---|---|---|
| 3341 780 A1 | 5/1985 | Germany . |

OTHER PUBLICATIONS

IEEE Journal of Solid–State Circuits, vol. 23, No. 2, Apr. 1988, A Low–Power 128MHZ VCO For Monlithic PLL IC's, Kato et al. pp. 474–479.

IEEE 1991 Bipolar Circuits and Technology Meeting 12–4, "A High Speed High Jitter Tolerant Clock and Data Recovery Circuit Using Crystal Based Dual PLL", Sam Yinshang Sun. pp. 293–296.

IEEE Journal of Solid–State Circuits vol. 28, No. 12, Dec. 1993, "A Monolithic 2.3 Gb/s 100–Mw Clock and Data Recovery Circuit in Silicon Bipolar Technology", Mehmet Soyuer. pp. 1310–1313.

Electronics Letters, vol. 30, No. 3, Feb. 1994, "1.1 Ghz Oscillator Using Bondwire Inductance", M. Steyaert et al. pp. 244–245.

IBM Technical Disclosure Bulletin, vol. 33, No. 5, Oct. 1990, Armonk, New York, US, pp. 260–262; XP000107456 "High–Frequency Voltage–Controlled Oscillator".

IEEE International Solid State Circuit Conference, vol. 31, Feb. 17–19, 1988, New York, NY, US, pp. 22/23,283 XP000031769, "High–Speed Date Recovery, A 250MHz Monolithic Voltage–Controlled Oscillator".

*Primary Examiner*—Siegfried H. Grimm
*Attorney, Agent, or Firm*—Hill, Steadman & Simpson

[57] ABSTRACT

The oscillation frequency of a non-externally voltage-controlled oscillator produces a control signal for the monolithic integrated voltage-controlled oscillator. This control signal is opposed to the influence of the operating temperature and the manufacturing parameters of the semiconductor chip in a similar way as the frequency of the voltage-controlled oscillator. The control signal is emitted through an iterative network consisting of a monostable multivibrator, a low-pass filter, and an amplifier. The iterative network produces an actuating signal for the voltage-controlled oscillator to counteract frequency deviations.

10 Claims, 3 Drawing Sheets

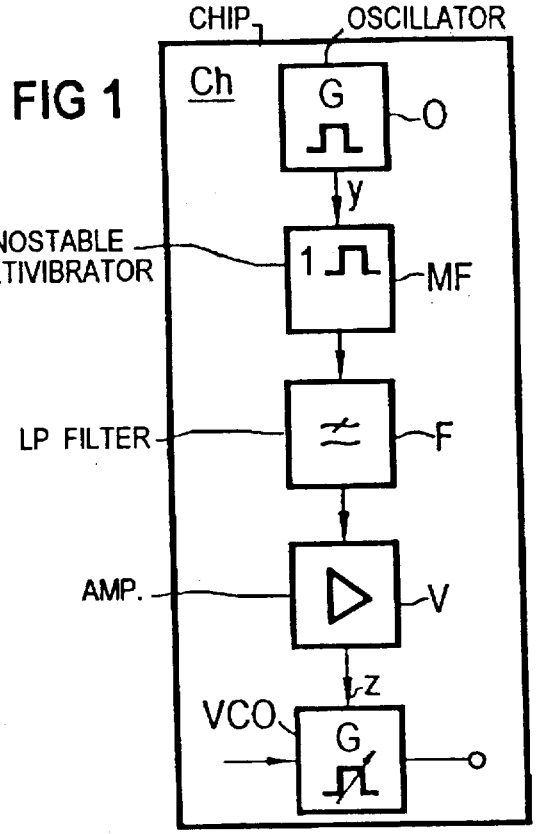
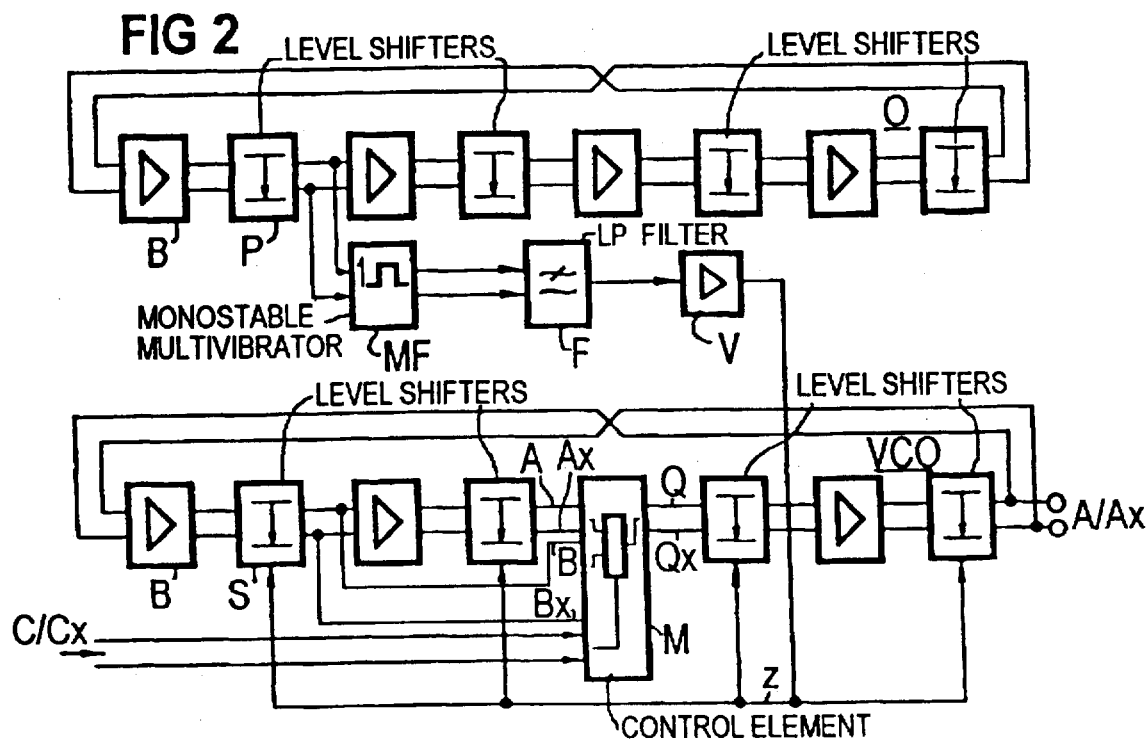

MONOSTABLE MULTIVIBRATOR

BUFFER CIRCUIT

LEVEL SHIFTERS

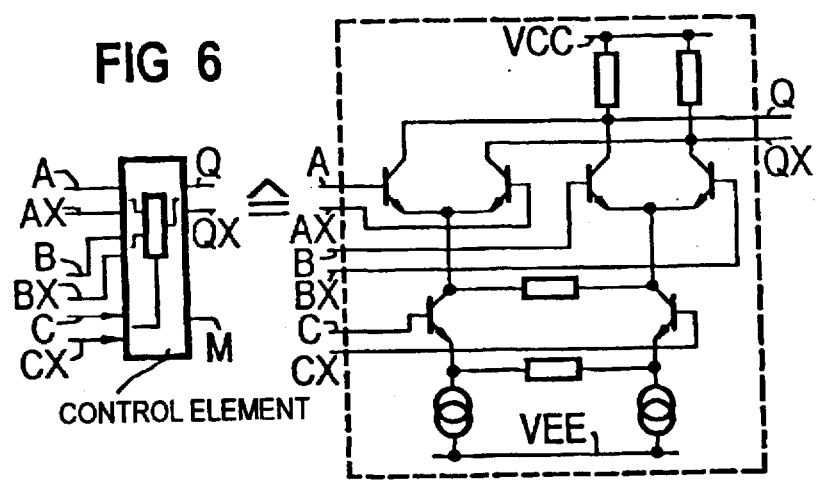

CIRCUIT ARRANGEMENT FOR COMPENSATING FREQUENCY DEVIATIONS OF A VOLTAGE-CONTROLLED OSCILLATOR, USING A SECOND OSCILLATOR

BACKGROUND OF THE INVENTION

1. Field of the Invention

Phase detectors are used in phase locked loops for clock recovery from a data signal. A phase detector supplies an output signal corresponding to the phase difference between its two input signals. The phase detector does not assist in clock recovery if the simultaneous frequency difference between the two phase detector input signals is too large. The frequency range of the voltage-controlled oscillator (VCO) must be as small as possible in order for the phase lock loop to lock onto the clock frequency.

2. Description of the Prior Art

The frequency range of a VCO integrated in ECL technology depends strongly on the operating temperature of the chip and the manufacturing-conditioned scatter of the semiconductor parameters. In order to ensure the oscillator oscillates at the desired frequency, the tunable frequency range is designed to be wide enough that the desired frequency can be reliably achieved not only in the normal case but also in the worst case; for this purpose the tuning range must be correspondingly large (larger than an octave). However, it is then no longer certain that the phase locked loop locks directly onto the correct frequency; the loop could for example also lock onto the double of this frequency.

This can be counteracted by adding the actuating signal of a reference phase locked loop to the actuating signal of the VCO. This requires a corresponding circuit outlay for such a reference clock and can lead to unwanted beat effects.

For frequency stabilization of a VCO in a thermostatic housing, it is known to provide an additional oscillator in the thermostatic housing as a temperature sensor. An actuating signal for the other oscillator and the control signal for thermostatic control are provided depending on the difference between the two oscillator frequencies.

U.S. Pat. No. 3,713,033 discloses a system for digitally correcting the frequency of a crystal oscillator as a function of ambient temperature. A circuit arrangement in which the frequency of another oscillator controlled by a thermistor is counted by a frequency counter. The count result is used to control a preprogrammed ROM. The ROM emits a frequency correction signal that after A/D conversion corrects the frequency of the quartz oscillator. The oscillator is temperature-compensated by another means.

U.S. Pat. No. 4,492,933 discloses a temperature compensation circuit for an oscillator circuit having a frequency response that is parabolic with respect to temperature. A circuit arrangement in an AC integrator circuit transforms a linear sawtooth signal into a parabolic sawtooth signal. The parabola flanks are sampled at a temperature-dependent phase. The flanks are then sampled at a corresponding different amplitude, by a monostable multivibrator, which is triggered by a comparator charged with the linear sawtooth signal and a temperature signal. The sampled signal amplitude controls the varactor.

These oscillator circuits are consistently expensive.

SUMMARY OF THE INVENTION

The invention provides a high-precision monolithic integrated VCO with a low circuit outlay.

The invention concerns a circuit arrangement for compensating frequency deviations of a VCO using a second oscillator. This circuit arrangement is achieved on the same chip with a monolithic integrated VCO, and an additional, similar oscillator that is not externally voltage-controlled. An additional control signal, opposed to the influence of temperature or parameter on the oscillator frequency, is derived from the oscillation frequency to the additional oscillator. In addition, in an alternative embodiment of the invention the output of the additional oscillator can be connected with an additional control input of the VCO via an iterative network of a monostable multivibrator and a subsequent low-pass.

The invention uses information derived from a reference clock. This information concerns the frequency of a similar oscillator, which is dependent on the temperature and the parameters of the chip in the same way as the VCO. The nominal frequencies of the two oscillators may be completely different. The invention compensates by providing a parameter-conditioned, temperature-conditioned frequency deviation of a monolithic integrated VCO.

Further characteristic features of the invention are explained below on the basis of an exemplary embodiment shown in the accompanying drawings.

DETAILED DESCRIPTION OF THE DRAWINGS

FIG. 1 is a block diagram of a preferred embodiment of a monolithic integrated VCO circuit.

FIG. 2 is a block diagram showing circuit details of the monolithic integrated VCO circuit according to the invention.

FIG. 6 is a schematic diagram of the control element for frequency control.

DETAILED DESCRIPTION OF THE PREFERRED EMBODIMENTS

FIG. 1 is a preferred embodiment of the voltage-controlled oscillator circuit VCO monolithically integrated on a chip Ch. An oscillator O is provided on the chip Ch in addition to the voltage-controlled oscillator VCO. The oscillator O is not externally voltage-controlled. The oscillation frequency of the oscillator O in principle depends on the operating temperature and the manufacturing parameters of the chip Ch the same way as the frequency of the voltage-controlled oscillator VCO depends on these characteristics. An additional control signal for the voltage-controlled oscillator VCO is derived from the oscillation frequency of the additional oscillator O. This additional control signal is opposed to the influence of the temperature and parameter characteristics of the chip Ch on the oscillator frequency of the voltage-controlled oscillator VCO.

As shown in FIG. 1, the output Y of the additional oscillator O is connected to an additional control input z of the voltage-controlled oscillator VCO via the iterative network of a monostable multivibrator MF, a low-pass filter F and an amplifier V. The output impulses of the oscillator O are lengthened to a fixed value (about ¼ of the period duration, given normal parameters and average temperature) by the monostable multivibrator MF. The pulse/pause relation of the square-pulse sequence depends on the oscillation frequency of the oscillator O. The direct component of this square-pulse sequence is brought out by the subsequent low-pass filter F. After amplification by the subsequent amplifier V, the amplified direct component then serves as an actuating signal for the voltage-controlled square-pulse oscillator VCO, counteracting possible frequency deviations.

In FIG. 2, a block diagram shows circuit details of a monolithic integrated voltage-controlled oscillator circuit VCO according to the invention. The oscillator O is formed with an inverting feedback-coupled iterative network of buffer circuits B and level shifters P. The actual voltage-controlled square pulse oscillator VCO is in principle formed in the same way, with a positive feedback-coupled iterative network of buffer circuits B and level shifters S. A control element M for frequency control is also provided in the iterative network. An iterative network of a monostable multivibrator MF, a low-pass F and an amplifier V is again provided between the oscillator O and the additional control input z of the voltage-controlled oscillator VCO.

Figure 3:
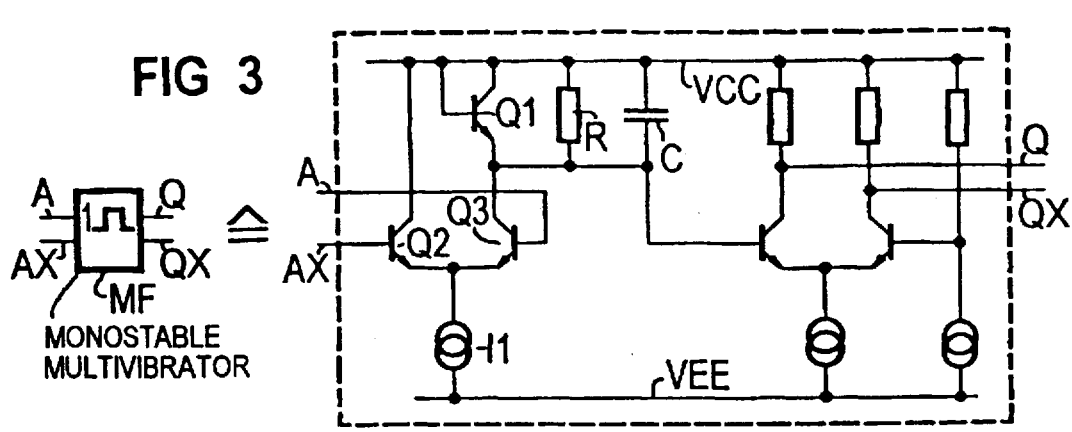
FIG. 3 is a schematic diagram of the monostable multivibrator.

The monostable multivibrator MF can be implemented as shown in FIG. 3. The time-determining elements of the ECL monostable multivibrator MF are the resistance R and the capacitance C. These must be implemented so that they are as independent as possible of the manufacturing parameters. This can be achieved when given a large resistance and the exploitation of the capacitance C between two wiring levels in the chip Ch. Transistor Q1 limits the voltage over the RC element, so that the capacitor C is always charged at a defined voltage. If warranted, the temperature dependency can be compensated by correction of the control voltage of the other transistor Q of the output buffer in the monostable multivibrator shown in FIG. 3. This is achieved by means of a corresponding temperature-dependent control of the associated current source, in a way which need not be further explained here.

Figure 4:
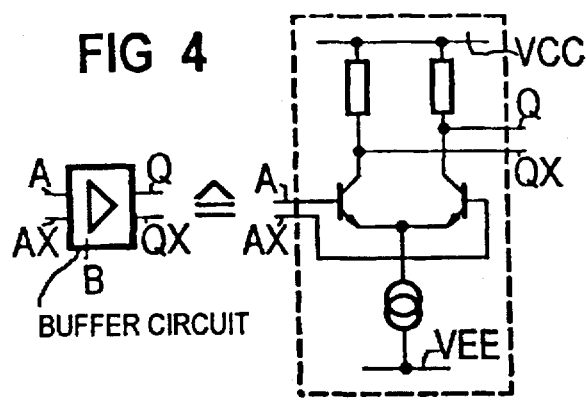
FIG. 4 is a schematic diagram of the ECL buffer circuits.

FIG. 4 shows an implementation of the ECL buffer circuits B.

Figure 5:
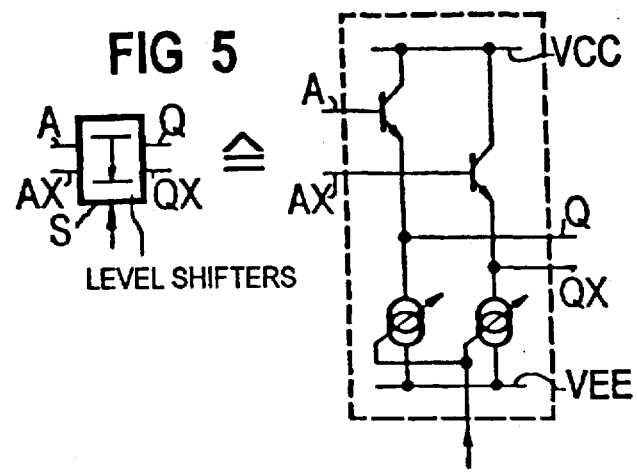
FIG. 5 is a schematic diagram of the ECL level shifters.

FIG. 5 shows ECL level shifters S. The ECL buffer circuits B are distinguished from the ECL level shifters S in that the cross current power sources are not controllable. The run time of an ECL buffer B depends on the cross current of the preceding level shifter P or S. The larger the cross current, the smaller the run time (within certain limits). This can be exploited to change the frequency of the oscillator.

The control element M for frequency control, provided in the voltage-controlled square-pulse oscillator VCO (in FIG. 1 and FIG. 2) can be implemented as shown in FIG. 6. According to FIG. 6, the frequency control M is an ECL analog signal multiplexer. Two inputs A/AX and B/BX in the voltage-controlled square pulse oscillator VCO as shown in FIG. 2 are connected to two consecutive level shifters S (via a buffer circuit B). The level shifters S control input C/CX forms the frequency control input of the voltage-controlled oscillator VCO (in FIG. 1 and FIG. 2). The voltage supplied between the control input connections C and CX, allows for setting the strength with which the signal appearing at the input A/AX or at the input B/BX affects the output Q/QX.

Although modifications and changes may be suggested by those skilled in the art, it is the intention of the inventors to embody within the patent warranted hereon all changes and modifications as reasonably and properly come within the scope of their contribution to the art.

I claim as my invention:

1. A circuit arrangement on a semiconductor chip for compensating frequency deviations of a monolithic integrated voltage-controlled oscillator having two inputs, said first input connected to a voltage control, comprising:

a second oscillator, non-externally voltage-controlled, including means for producing a control signal, for the monolithic voltage-controlled oscillator opposed to temperature and parameter conditions of the chip, at an output of the second oscillator;

an iterative network for producing an actuating signal to counteract frequency deviations comprising a monostable multivibrator, a low pass filter, and an amplifier connected in series between said output of the second oscillator and the second input of the monolithic voltage-controlled oscillator.

2. The circuit arrangement according to claim 1, wherein said means for producing the control signal is the oscillation frequency of the second oscillator.

3. The circuit arrangement according to claim 1 wherein the two oscillators further comprise a feed-back coupled iterative network consisting of ECL buffer circuits and level shifters.

4. The circuit arrangement according to claim 1 further comprising:

a means for controlling frequency in the voltage-controlled oscillator.

5. The circuit arrangement according to claim 4, the means for controlling frequency in the voltage-controlled oscillator further comprising:

first, second and third level shifters; and an analog signal multiplexer having a frequency control input connected to said first input of the voltage-controlled oscillator, second and third inputs respectively connected to the outputs of said first and second level shifters, and an output connected to said third level shifter.

6. A method for compensating frequency deviations of a monolithic integrated voltage-controlled oscillator on a semiconductor chip, the method comprising the steps of:

producing frequency deviations of a monolithic integrated non-voltage-controlled oscillator on said semiconductor chip;

producing a control signal, corresponding to the frequency deviations of said monolithic integrated non-voltage-controlled oscillator and opposed to temperature and parameter conditions of the chip, for the voltage-controlled oscillator;

producing an actuating signal corresponding to the control signal to counteract frequency deviations; and controlling the frequency of the voltage-controlled oscillator with the actuating signal.

7. A circuit arrangement on a semiconductor chip for compensating frequency deviations of a monolithic integrated voltage-controlled oscillator having two inputs, said first input connected to a voltage control, comprising:

a second oscillator, non-externally voltage-controlled, having corresponding frequency deviations, including means for producing a control signal for the monolithic voltage-controlled oscillator opposed to temperature and parameter conditions of the chip at an output of the second oscillator; and an iterative network for producing an actuating signal to counteract frequency deviations of the monolithic voltage-controlled oscillator comprising a monostable multi-vibrator, a low pass filter, and an amplifier connected in series between said output of the second oscillator and the second input of the monolithic voltage-controlled oscillator.

8. The circuit arrangement according to claim 7, wherein said means for producing the control signal is an oscillation frequency of the second oscillator.

9. The circuit arrangement according to claim 7, wherein the two oscillators further comprise a feed-back coupled iterative network consisting of ECL buffer circuits and level shifters.

10. The circuit arrangement according to claim 7 further comprising:

means for controlling frequency in the voltage-controlled oscillator.

* * * * *